United States Patent [19]

Voyce

[11] Patent Number: 4,754,277
[45] Date of Patent: Jun. 28, 1988

[54] APPARATUS AND METHOD FOR PRODUCING LINEAR FREQUENCY SWEEP

[75] Inventor: Kenneth G. Voyce, Bellevue, Wash.

[73] Assignee: The Boeing Company, Seattle, Wash.

[21] Appl. No.: 902,658

[22] Filed: Sep. 2, 1986

[51] Int. Cl.$^4$ ............................................. G01S 13/32
[52] U.S. Cl. .......................................... 342/83; 331/4
[58] Field of Search .................... 342/83, 128, 200; 331/4, 178, 17, 179

[56] References Cited

U.S. PATENT DOCUMENTS

| | | | |
|---|---|---|---|
| 3,344,423 | 9/1967 | Thue | 342/128 X |
| 3,621,450 | 11/1971 | Blair et al. | 331/10 |
| 3,699,448 | 10/1972 | Martin et al. | 331/4 |
| 3,958,186 | 5/1976 | Jesse et al. | 331/4 |
| 4,038,612 | 7/1977 | Borofka et al. | 331/4 X |
| 4,047,223 | 9/1977 | Hoffman | 331/4 X |
| 4,245,196 | 1/1981 | Peebles, Jr. et al. | 331/178 |
| 4,336,511 | 6/1982 | Stromswold et al. | 331/178 |
| 4,434,407 | 2/1984 | Healey et al. | 331/4 |
| 4,442,412 | 4/1984 | Smith et al. | 331/4 X |

OTHER PUBLICATIONS

LaRue A. Hoffman, K. H. Hurlbut, D. E. Kind, H. J. Wintroub, "A 94-GHz Radar for Space Object Identification," IEEE TRANSACTIONS ON MICROWAVE THEORY & TECHNIQUES, vol. MTT-17, No. 12, Dec. 1969, pp. 1145-1149.

W. J. Caputi, "Stabilized Linear FM Generator," IEEE TRANSACTIONS ON AEROSPACE & ELECTRONIC SYSTEMS, vol. AES-9, No. 5, Sep. 1973, pp. 670-678.

Dan R. Bromaghim, John P. Perry, "A Wideband Linear FM Ramp Generator for the Long-Range Imaging Radar," IEEE TRANSACTIONS ON MICROWAVE THEORY & TECHNIQUES, vol. MTT-26, No. 5, May 1978, pp. 322-325.

Peyton Z. Peebles, Jr., "Design of a Highly Linear Closed-Loop FMCW Sweep Generator," Technical Report T-79-78 of U.S. Army Missile Command, Redstone Arsenal, Alabama, Aug. 8, 1979.

"Conference on Performance of a Linear FM Radar Transmitter at 35 GHz", Peyton Peebles and A. H. Green, Apr. 1982.

*Primary Examiner*—Thomas H. Tarcza
*Assistant Examiner*—Tod Swann
*Attorney, Agent, or Firm*—Christensen, O'Connor, Johnson & Kindness

[57] ABSTRACT

A circuit and method for generating an output signal having an output frequency that varies linearly with time, and an FM CW radar system utilizing such a circuit. The circuit includes a VCO, a rate detector, a phase detector, a filter and an integrator. The VCO produces an output signal at its output terminal at an output frequency that corresponds to the voltage of a tuning signal applied to the VCO input terminal. The rate detector receives the output signal and produces a rate signal having a rate frequency that corresponds to the rate of change of the output frequency. The phase detector compares the rate signal to a reference signal having a fixed frequency, and produces a correction signal corresponding to the phase difference between the rate and reference signals. The filter filters the correction signal to produce a first current signal, and the integrator integrates the first current signal to produce the tuning signal. The circuit may also include a current source for producing a constant magnitude second current signal, in which case the integrator integrates the combined first and second current signals to produce the tuning signal.

20 Claims, 4 Drawing Sheets

APPARATUS AND METHOD FOR PRODUCING LINEAR FREQUENCY SWEEP

FIELD OF THE INVENTION

The present invention relates to circuits that produce output signals having frequencies that vary linearly with time, and to FM CW radars employing linear frequency sweeps.

BACKGROUND OF THE INVENTION

In one type of radar system, the transmitter is driven by a CW signal having a frequency that varies linearly with time. The signal is derived from a voltage controlled oscillator (VCO), and the input signal to the VCO is controlled to produce the linear frequency sweep. The return signal from a target is mixed with the transmitted signal to produce a difference signal having a frequency equal to the difference between the instantaneous frequency of the transmitted signal and the return signal. Because the frequency of the transmitted signal changes linearly with time, the frequency of the difference signal is a function of target range.

In the system of the type described above, there are three fundamental problems that must be solved to develop an effective radar. The first problem is that the frequency sweep must be highly linear, in order for the radar to have adequate range resolution. This is a difficult problem, because even the best RF sources have nonlinear tuning characteristics, i.e., the frequency of the VCO output signal is not a linear function of the input voltage. The second problem relates to radar systems in which the antenna is scanned. In such systems, the sweep rate must be fast enough to allow the required scanning rates. The requirement for a fast sweep rate is a particular problem when a real time closed loop linearization scheme is to be used. This problem results from the fact that faster sweep rates require wider bandwidth loops, but loop bandwidth can be expanded only to the point where stability is threatened by component limitations such as amplifier bandwidths, delay, and unwanted capacitance. The third problem in designing an effective FM CW radar is that the linearization of the sweep must be able to adapt immediately to changes in the tuning characteristics of the VCO, which tuning characteristics depend on the terminating impedance at the RF output. This terminating impedance does not remain constant because the antenna must scan, and because polarization switching may occur.

Past efforts to product a fast, linear frequency sweep have involved both open loop and closed loop designs. To date, open loop techniques have proved nearly impossible to align. If and when they are aligned, they are still sensitive to changes in temperature. Closed loop designs have included phase lock loops in which a signal representing the rate of change of the frequency of the transmitted signal is phase locked to a crystal source. Such techniques in the past have been unable to follow a frequency slope with zero error. Prior phase lock loop attempts have also required a summation amplifier to drive the tuning input of the RF source. However, it has been found that it is very difficult to design such a circuit with a sweep rate fast enough to allow the use of a scanning antenna and with high range resolution.

SUMMARY OF THE INVENTION

The present invention provides an apparatus and method for generating an output signal having an output frequency that varies linearly with time, and to an FM CW radar system that utilizes such a circuit. The circuit of the present invention provides a significant improvement in the linearity of the sweep of the output frequency, such that high accuracies can be obtained, even in the context of a high sweep rate, scanning radar system.

The apparatus of the present invention comprises a voltage controlled oscillator, rate detector means, phase detection means, filter means and integration means. The voltage controlled oscillator has input and output terminals, and produces an output signal at its output terminal, such that the output signal frequency corresponds to the voltage of a tuning signal applied to the input terminal. The rate detector means receives the output signal and produces a periodic rate signal having a rate frequency corresponding to the rate of change of the output signal frequency. Phase detection means compares the rate signal to a reference signal having a fixed reference frequency, and produces a correction signal corresponding to the difference between the rate and reference phases. Filter means filters the corrections signal to produce a first current signal, and the first current signal is integrated by the integration means to produce the tuning signal.

The circuit may further comprise a current source for producing a fixed current signal, whereby the integration means integrates the combined first and second current signals to produce the tuning signal. The entire circuit preferably comprises a type II phase lock loop. To provide for a sweep that is both linear and repeatable from sweep to sweep, the reference signal is phase locked to the sweep rate, and there is an integer relationship between the sweep frequency and the frequency of the reference signal. In a typical radar application, the voltage controlled oscillator is a Gunn oscillator adapted to produce the output signal at an output frequency in the MMW frequency band.

DETAILED DESCRIPTION OF THE INVENTION

Figure 1:
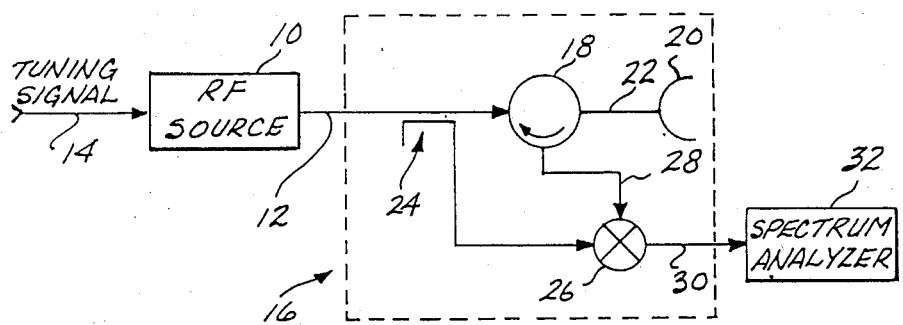
FIG. 1 is a simplified diagram of a prior art FM CW radar system.
Figure 2:
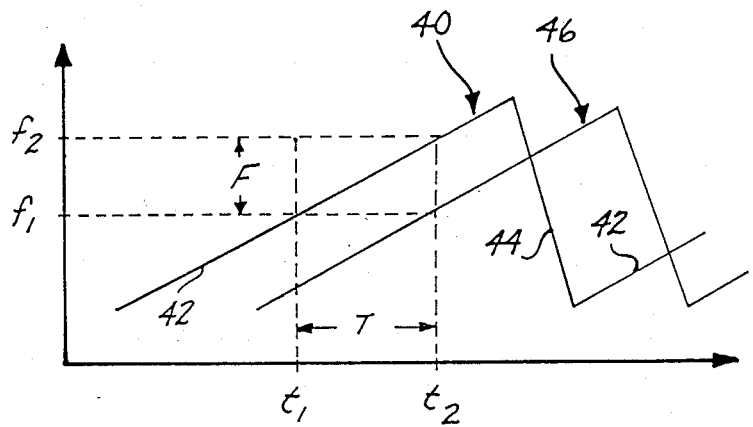
FIG. 2 is a signal diagram for the radar system of FIG. 1.

FIGS. 1 and 2 illustrate the general principles of operation of an FM CW radar system. The system comprises an RF source 10 having an output terminal connected to line 12 and an input terminal connected to line 14. RF source 10 produces an output signal on line 12 having a frequency determined by the voltage of a tuning signal on line 14. The output signal is fed to antenna system 16 that comprises circulator 18, antenna 20, directional coupler 24 and mixer 26. The output signal from the RF source on line 12 is input to circulator 18 and directed by the circulator to antenna 20 via line 22. A sample of the output signal on line 12 is picked off by directional coupler 24 and input to one terminal of mixer 26. A return signal from a target passes through antenna 20, line 22, circulator 18, and the circulator passes the return signal to a second terminal of mixer 26 via line 28. Mixer 26 produces an IF signal on line 30 having a frequency equal to the difference between the instantaneous frquencies of the output signal on line 14 and the return signal. The difference frequency is input to a frequency measuring device such as spectrum analyzer 32.

In the operation of the system shown in FIG. 1, the tuning signal on line 14 is caused to sweep over a prescribed voltage range, such that the frequency of the output signal on line 12 sweeps through a prescribed frequency range. The frequency of the output signal is schematically illustrated by graph 40 in FIG. 2. Graph 40 comprises sweep portions 42 and retrace portions 44. Assuming that there is a target at a fixed range from antenna 20, the return from such a target is illustrated by graph 46 in FIG. 2. If the time required for a radar signal to make a round trip from the antenna to the target and back to the antenna is designated by T, when the radar signal transmitted at time $t_1$ at frequency $f_1$ will return to the radar system at time $t_2$, where $t_2$ is equal to $t_1+T$. At time $t_2$, the return signal at frequency $f_1$ will be mixed with the instantaneous value of the transmitted signal at frequency $f_2$, and mixer 26 will produce a difference signal at frequency F. If ramp portion 42 is linear, then difference frequency F will be an accurate measure of time T, and therefore of the range to the target.

Because even the best RF sources have nonlinear voltage-frequency characteristics, it has generally been found very difficult to produce a linear frequency sweep when RF source 10 is a voltage controlled oscillator (VCO) connected in an open loop arrangement. In order to increase the linearity of the sweep, closed loop RF sources such as the one shown in FIG. 3 have been proposed. The RF source shown in FIG. 3 includes VCO 50 having an output terminal connected to line 52, and an input terminal connected to line 54. Summing junction 56 creates a VCO input signal on line 54 by combining a tuning signal on line 48 with an error or feedback signal on line 58. The tuning signal preferably comprises a signal having a voltage varying linearly with time, and the error signal on line 58 operates to correct or adjust the tuning signal to accommodate nonlinearities caused by VCO 50 or other factors.

The error signal on line 58 is produced by a loop comprising rate detector 60, phase detector 62, reference oscillator 64 and loop filter 66. The VCO output signal on line 52 is fed to the rate detector as well as to the antenna system. The rate detector comprises delay circuit 68 and mixer 70. The rate detector operates by mixing the output signal on line 52 with a delayed version of the same output signal, to produce a rate signal on line 72. As illustrated in FIG. 2 with respect to the radar system of FIG. 1, mixing a given signal with a delayed version of itself produces an output signal that has a constant frequency when the frequency of the original signal is varying in a linear manner. The rate signal on line 72 will therefore have a constant frequency only when the frequency of the output signal on line 52 is changing at a constant rate, i.e., only when VCO 50 is producing a linear output sweep.

Phase detector 62 and loop filter 66 operate to phase-lock the rate signal on line 72 to a constant frequency reference signal produced by reference oscillator 64 on line 74. The delay produced by delay circuit 68 is selected such that when VCO 50 is linearly sweeping the frequency of the output signal on line 52, the frequency of the rate signal on line 72 is identical to the frequency of the reference signal on line 74. Under these circumstances, phase detector 62 produces a zero output signal on line 76, and this output signal is converted to a null error signal on line 58 by loop filter 66. However, should the output signal on line 52 change in a nonlinear fashion with time, then the frequency of rate signal on line 72 will vary, resulting in a nonzero error signal on line 58 that is subtracted from the tuning signal to produce the input signal on line 54.

Figure 3:
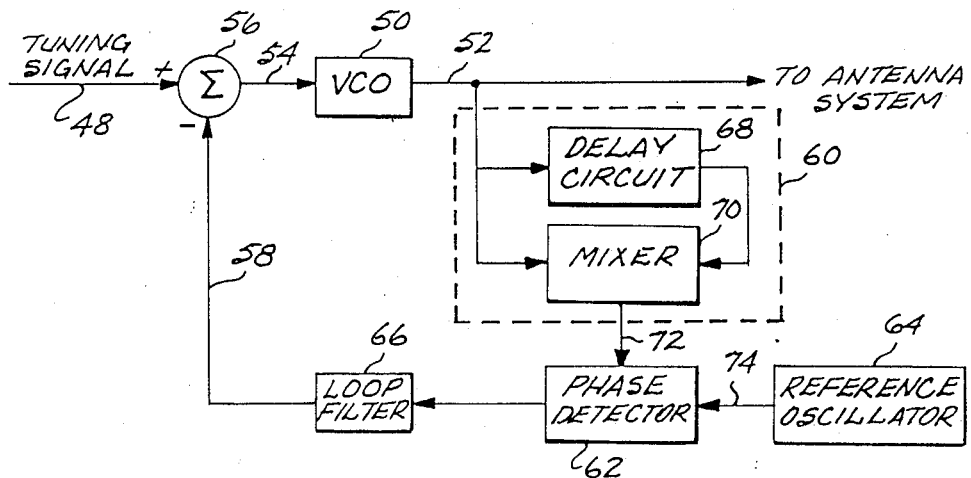
FIG. 3 is a block diagram of a prior art RF source.

Closed loop linearization techniques, such as the technique shown in FIG. 3, can provide significant improvements as compared to open loop systems. Nevertheless, the degree of linearity that can be produced by the phaselock loop approach of FIG. 3 is limited by a number of factors. The presence of rate detector 60 in the loop is equivalent to placing a differentiator in the loop, thereby converting the loop into a first order phase lock loop. As a result, the loop cannot fully track a linearly varying tuning signal. A further limitation of the sysem of FIG. 3 occurs when high sweep rates are required, such as in a system in which the antenna is to be scanned. For a high sweep rate, scanning radar system, it has been found that it is extremely difficult to efficiently drive VCO 50. This problem arises because, in most practical systems, the coaxial cable used for line 58 and/or line 54 has an appreciable capacitance, thereby requiring the loop filter to have a very high output capacity in order to have the phase lock loop operate properly.

Figure 4:
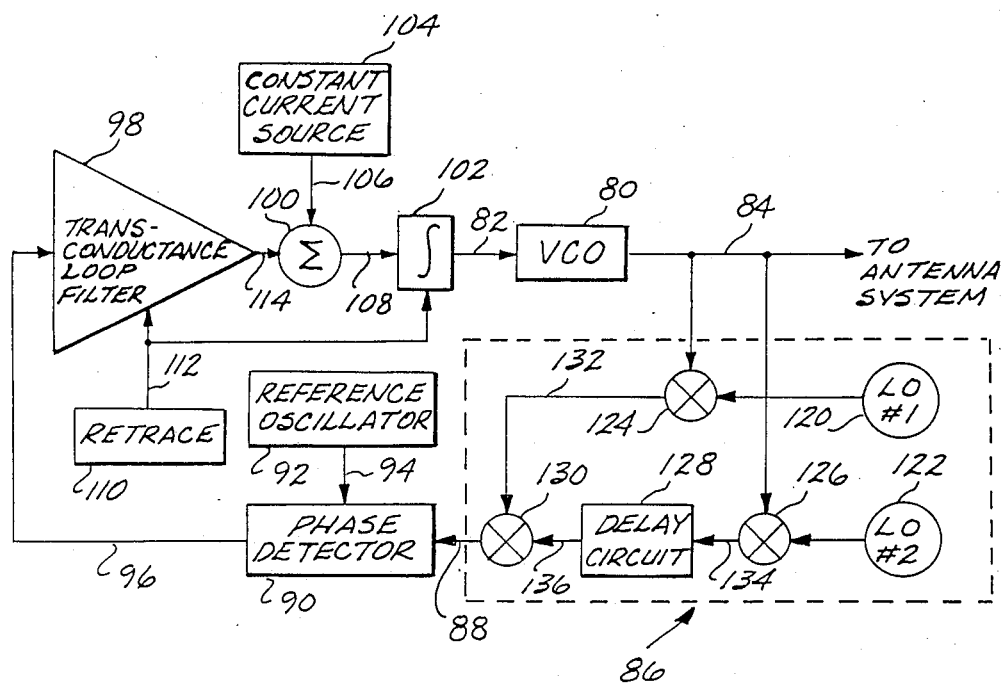
FIG. 4 is a block diagram of a preferred embodiment of the apparatus of the present invention.

FIG. 4 presents a block diagram of a preferred embodiment of the present invention. Like the prior art FIG. 3 embodiment, the RF source of FIG. 4 comprises VCO 80 that has an input terminal connected to line 82 and an output terminal connected to line 84. The output signal provided by VCO 80 on line 84 is fed to the antenna system, and is also input to rate detector 86. The rate detector produces a rate signal on line 88 that will have a constant frequency when the frequency of the output signal on line 84 is varying at a constant rate. Phase detector 90 compares the frequency of the rate signal on line 88 with the frequency of a reference signal provided by reference oscillator 92 on line 94. The phase detector produces an output signal on line 96 having a magnitude that is a function of the nonlinearity of the frequency sweep of the VCO output signal.

In the arrangement of FIG. 4, the phase lock loop is completed by means of transconductance loop filter 98, summing junction 100, and integrator 102. Transconductance loop filter 98 provides a current error signal on line 114 that is proportional to the voltage of the phase detector output signal on line 96. Summing junction 100 combines the current provided by the transconductance loop filter 98 on line 114 with a fixed current from constant current source 104 on line 106. The resulting combined current signal on line 108 is input to integrator 102. Integrator 102 integrates the current signal on line 108 to provide an integrated voltage signal on line 82 that forms the input signal to VCO 80. Retrace circuit 110 provides a sweep signal on line 112 that is input to transconductance loop filter 98 and integrator 102. The sweep signal reinitializes the loop filter, and dumps the charge on integrator 102, at the end of each frequency sweep.

In the system of FIG. 4, rate detector 86 comrises local oscillators 120 and 122, mixers 124 and 126, delay circuit 128, and mixer 130. Local oscillators 120 and 122 are phase locked with respect to one another, and operate at a fixed frequency difference. Mixer 124 combines the output signal on line 84 with the signal from local oscillator 120 to produce a first IF signal on line 132. Mixer 126 combines the signal from local oscillator 122 with the output signal on line 84 to provide a second IF signal on line 134. The second IF signal is delayed by delay circuit 128 to produce a delayed second IF signal on line 136. Mixer 136 combines the first IF signal with the delayed second IF signal to produce the rate signal on line 88.

The use of two local oscillators in rate detector 86 provides the advantage that the frequency of the rate signal on line 88, and therefore the frequency of the reference signal on line 94, can conveniently be placed outside the bandwidth of the phase lock loop. A numerical example may help to clarify this feature. Assume that the phase loop has a bandwidth on the order of 2–3 megahertz. In a system of the type shown in FIG. 3, the frequency of the rate signal (on line 72 of that figure) is set by the sweep rate and the delay time produced by delay circuit 68. A delay circuit typically comprises a coaxial cable delay line of the appropriate length. However, a coaxial cable delay line that is long enough to produce a rate signal higher than the 2–3 megahertz loop bandwidth will often result in loop stability problems. Therefore, in general, shorter delays must be used, so that the rate and reference signals will be within the loop bandwidth. As a result, these signals may leak through the phase detector and detract from the performance of the phase lock loop. In the arrangement of FIG. 4, the signals produced by local oscillators 120 and 122 are selected to be a fixed distance apart, such as 100 megahertz. If delay line 128 provides an additional 1 megahertz frequency difference, then the frequency of the rate signal on line 88 will be 101 megahertz, well outside the loop bandwidth. Local oscillators 120 and 122 also provide the further advantage that the signals processed by delay circuit 128 and mixer 130 may be adjusted down to a conventional IF frequency.

In the system shown in FIG. 4, the VCO input signal on line 82 is a voltage signal provided by integrator 102. Integrator 102 integrates the current signal on line 108, such current signal being comprised of a fixed current signal on line 106 and an error current signal on line 114. Constant current source 104 is therefore analogous to the tuning signal on line 48 of the embodiment of FIG. 3, and the error current signal on line 114 is analogous to the error signal on line 58 of FIG. 3. With respect to the embodiment of FIG. 3, it was previously pointed out that the unwanted capacitance in lines 56 and/or 54 made it difficult to properly drive VCO 50. The present invention sidesteps this issue by providing an integrator (e.g., a capacitor ) at the VCO input, thereby eliminating error sources due to capacitances in lines 114, 108 and 82.

The open loop transfer function of the system shown in FIG. 4 is equal to the product of the transfer functions of VCO 80, rate detector 86, phase detector 90, transconductance loop filter 98 and integrator 102. This transfer function is:

$$\frac{K_o}{s} \cdot [st_o e^{-st_o}] \cdot K_D \cdot \left[ \frac{1 + st_2}{sR_e t_1} \right] \cdot \frac{1}{sC_s} \quad (1)$$

where $t_0$ is the delay produced by delay circuit 128, $t_1$ and $t_2$ are time constants for transconductance loop filter 98, $K_o$ is the VCO gain factor, $K_D$ is the phase detector gain factor, $R_e$ is a constant associated with transconductance loop filter 98, and $C_s$ is a constant associated with integrator 102. It can be seen from Equation (1) that the open loop transfer function is a transfer function of a type II phase lock loop. In effect, integrator 102 has compensated for the presence of rate detector 86, to achieve a type II loop. As a result, the system of FIG. 4 can track a linearly varying input provided by constant current source 104 with zero error.

Figure 5:
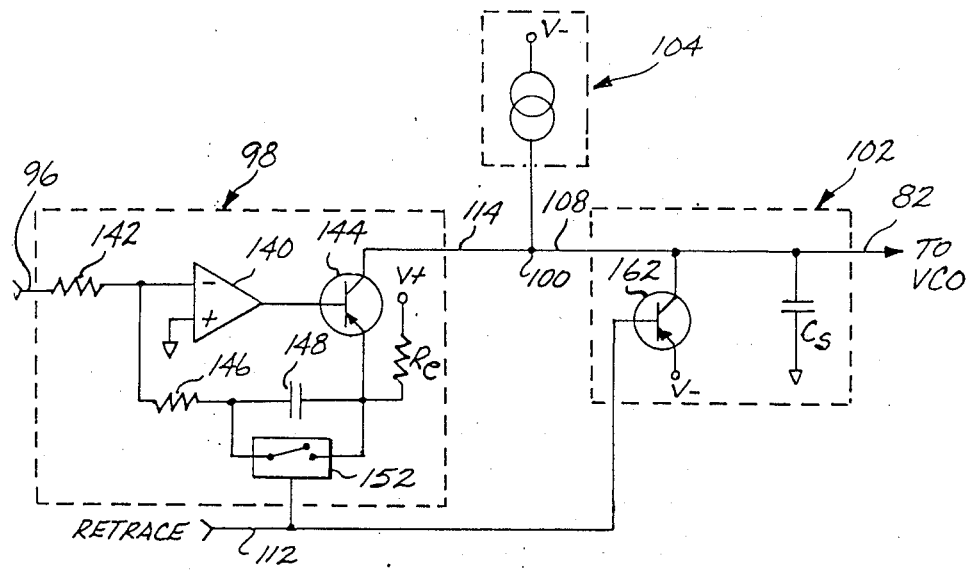
FIG. 5 is a circuit diagram of the transconductance loop filter and the integrator.

FIG. 5 presents further details of a preferred embodiment of transconductance loop filter 98 and integrator 102. The transconductance loop filter comprises amplifier 140 having its noninverting input connected to ground and its inverting input connected to receive the error signal on line 96 via resistor 142. A feedback path is provided for amplifier 140 consisting of the emitter base junction of transistor 144, resistor 146 and capacitor 148. The emitter of transistor 144 is connected to a positive voltage supply ($V_+$) via resistor $R_e$, and the collector of transistor 144 forms the output of the transconductance loop filter on line 114. Normally open switch 152 is connected in parallel with capacitor 148. Switch 152 is closed by the retrace signal on line 112, to thereby reinitialize transconductance loop filter 98 during the retrace period.

Integrator 102 preferably comprises capacitor $C_s$ and transistor 162. Capacitor $C_s$ is connected between line 108 and ground, line 108 being connected between summing junction (node) 100 and line 82. Transistor 162 is connected between line 108 and a negative voltage supply ($V_-$), and operates to dump the charge on capacitor $C_s$ in response to a retrace signal.

In one particular preferred embodiment of the invention shown in FIGS. 4 and 5, VCO 80 is a tunable Gunn oscillator that is swept in frequency from 45–45.7 GHz in about 50 microseconds, a sweep speed that is fast enough for use in a scanned antenna operation. Local oscillators 120 and 122 operate at 43.6 GHz and 43.7 GHz, respectively, the local oscillators being phase locked to one another to produce a fixed offset frequency of 100 MHz. Thus the frequency of the first IF signal on line 132 sweeps from 1.4–2.1 GHz, and the frequency of the second IF signal on line 134 sweeps from 1.3–2.0 GHz. Delay line 128 is a 63-foot length of coaxial cable that produces a 92.5 nanosecond delay that corresponds to a 1.25 MHz frequency difference. Thus, when VCO 80 is sweeping linearly, rate detector 86 produces a rate signal on line 88 having a frequency of 101.25 MHz. In this embodiment, reference oscillator 92 produces a reference signal having the same 101.25 MHz frequency. In effect, the rate signal on line 88 is phase locked by the entire loop to a reference source of 101.25 MHz. In this embodiment, transconductance loop filter 98 preferably establishes a loop bandwidth of 2 MHz, and has a damping factor of 0.707. These vary throughout a sweep as the result of the nonlinear tuning characteristic of the Gunn oscillator. The loop error current and the fixed current are summed and converted to a voltage by integrating capacitor $C_S$, which voltage is connected directly to the Gunn tuning input. Therefore, the error summation, the extra loop integration, and the interface to the Gunn oscillator are accomplished at a single circuit node. By driving the Gunn oscillator in this way, the integrating capacitance is essentially in parallel with the cable and device capacitance, so that these capacitances are actually a part of the integrator. This eliminates the need for a wideband buffer amplifier that will drive the unwanted capacitance.

Figure 6:
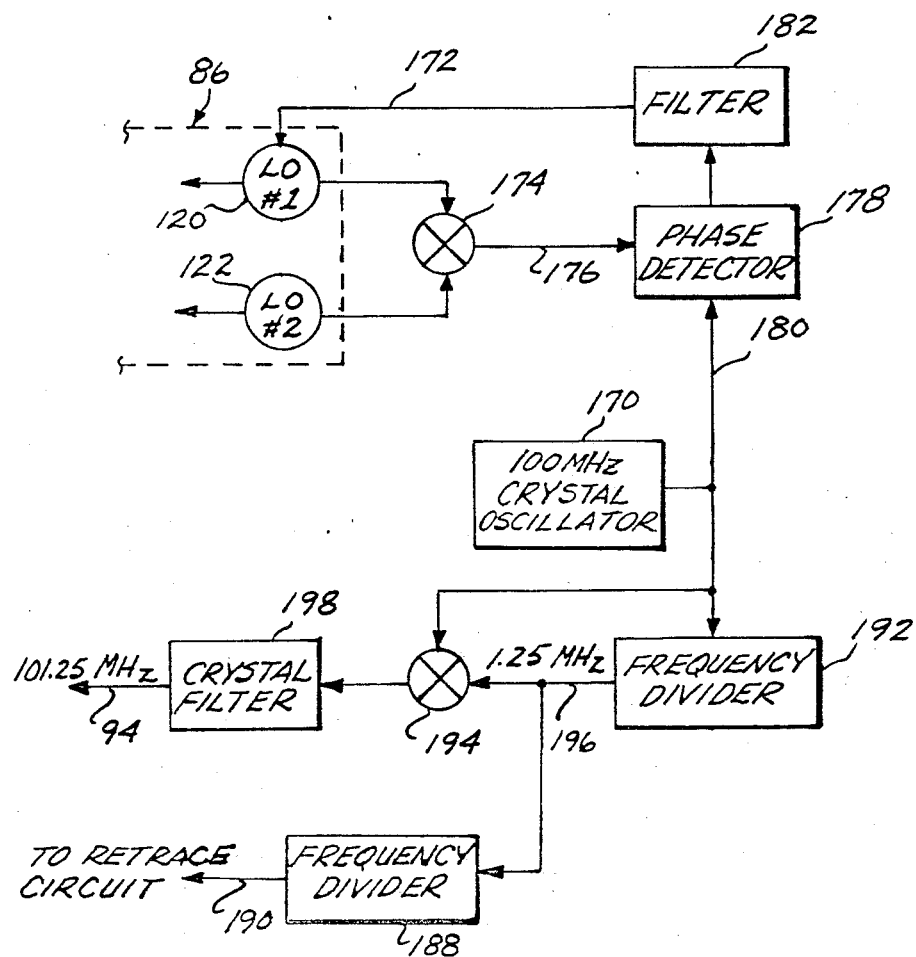
FIG. 6 is a block diagram illustrating the production of coherent mixing, reference and sweep signals.

An important consideration for an FM CW radar system, aside from sweep linearity, is sweep repeatability. Repeatability refers to the fact that the linear sweep rate is the same from one sweep to the next. Sweep repeatability requires that the 100 MHz difference signal that would be produced by mixing the signals provided by local oscillators 120 and 122 be coherent, i.e., phase locked, with respect to the reference signal produced by reference oscillator 92 on line 94 and the sweep signal produced by retrace circuit 110. Sweep repeatability further requires that there be an integer relationship between the sweep signal frequency and the frequencies of the 100 MHz difference signal and the reference signal. A preferred system for achieving the required phase coherencies and integer relationship is set forth in FIG. 6. The heart of the system shown in FIG. 6 is oscillator 170 that is crystal controlled to operate a stable frequency of 100 MHz. FIG. 6 illustrates local oscillators 120 and 122 of rate detector 86. In this embodiment, local oscillator 120 is a VCO having a center frequency that is adjustable by means of a tuning signal on line 172. The outputs of local oscillators 120 and 122 are mixed in mixer 174, and the resulting difference signal on line 176 is input to phase detector 178. The phase detector also receives the 100 MHz signal produced by oscillator 170 on line 180. The output of phase detector 178 passes through filter 182, and the filter proves a tuning signal for local oscillator 120 on line 172. Thus the frequency difference between local oscillators 120 and 122 is phase locked to the 100 MHz signal produced by oscillator 170.

The 100 MHz signal provided by oscillator 170 on line 180 is also input to frequency divider 192 and to mixer 194. Frequency divider 192 divides the 100 MHz signal to produce a 1.25 MHz signal on line 196 that forms the other input to mixer 194. The resulting mixed signal is input to crystal filter 198. The crystal filter preferentially selects the 101.25 MHz component of the mixed signal, to produce the reference signal on line 94. The 1.25 MHz signal on line 196 is also input to frequency divider 188, The division factor of frequency divider 188 being suitable for producing a sweep signal on line 190 of the appropriate frequency. For example, in the radar system illustrated above, a sweep period of 50 microseconds was assumed, and in such a system the sweep signal on line 190 would have a frequency on the order of 20 kHz. As a result of the described arrangement, both the reference signal on line 194 and the difference signal on line 176 will be phase locked to the sweep signal, and there will be an integer relationship between the sweep signal frequency and the frequencies of such reference and difference signals.

While the preferred embodiments of the invention have been illustrated and described, it is to be understood that variations will be apparent to those skilled in the art. Accordingly, the invention is not to be limited to the specific embodiments illustrated and described, and the true scope of the invention is to be determined by reference to the following claims.

The embodiments of the invention in which an exclusive property or privilege is claimed are defined as follows:

1. A circuit for generating a periodic output signal having an output frequency that varies linearly with time, the circuit comprising:

a voltage controlled oscillator having input and output terminals, an input capacitance associated with its input terminal, and operative to produce the output signal at its output terminal at the output frequency such that the output frequency corresponds to the voltage of a tuning signal applied to the input terminal;

rate detector means responsive to the output signal for producing a periodic rate signal having a rate frequency corresponding to the rate of change of the output frequency;

phase detection means for comparing the rate signal to a periodic reference signal having a fixed reference frequency, and for producing a correction signal having a voltage corresponding to the difference between the phase of the rate and reference signals;

transconductance filter means for filtering the correction signal to produce a first current signal, which is a function of the voltage of the correction signal; and integration means for integrating the first current signal to produce the tuning signal said integration means including an integration capacitance substantially comprising the inherent capacitance of a conductor carrying the first current signal and the input capacitance of the voltage controlled oscillator.

2. The circuit of claim 1, further comprising a current source for producing a second current signal having a constant magnitude, and wherein the integration means integrates the combined first and second current signals to produce the tuning signal.

3. The circuit of claim 1, further comprising retrace means for producing a periodic retrace signal operative to periodically initialize the integration means, to thereby cause the output signal to periodically sweep in frequency.

4. The circuit of claim 3, wherein the reference signal and the retrace signal are coherent, and wherein there is an integer relationship between the frequencies of the reference and retrace signals.

5. The circuit of claim 1, wherein the rate detector means comprises a first local oscillator for producing a periodic first mixing signal at a first mixing frequency, first mixing means for combining the first mixing signal with the output signal to produce a periodic first IF signal at a first IF frequency equal to the difference between the output and first mixing frequencies, a second local oscillator for producing a periodic second mixing signal at a second mixing frequency, second mixing means for combining the second mixing signal with the output signal to produce a periodic second IF signal at a second IF frequency equal to the difference between the output and second mixing frequencies, delay means for delaying the second IF signal by a predetermined time delay to produce a delayed second IF signal, and third mixing means for combining the first IF signal with the delayed second IF signal to produce the rate signal.

6. The circuit of claim 5, wherein the reference signal and the difference between the first and second mixing signals are coherent with respect to one another, and wherein there is an integer relationship between the frequency of the reference signal and the frequency of the difference signal between the first and second mixing signals.

7. The circuit of claim 1, wherein the voltage controlled oscillator, the rate detector means, the phase detection means, the filter means and the integration means comprise a type II phase lock loop.

8. The circuit of claim 7, wherein the rate frequency is outside the bandwidth of the phase lock loop.

9. The circuit of claim 1, wherein the voltage controlled oscillator is a Gunn oscillator and wherein the output frequency is in the MMW frequency band.

10. In an FM CW radar system comprising an RF source for producing a periodic output signal having an output frequency that sweeps linearly with time, an antenna, a mixer having first and second input terminals, means for coupling the output signal to the antenna and to the first input terminal of the mixer, and means for coupling a return signal received at the antenna to the second input terminal of the mixer, whereby the mixer produces a range signal having a frequency corresponding to target range, an improved RF source comprising:
   a voltage controlled oscillator having input and output terminals, an input capacitance associated with its input terminal, and operative to produce the output signal at its output terminal at the output frequency such that the output frequency corresponds to the voltage of a tuning signal applied to the input terminal;
   rate detector means responsive to the output signal for producing a periodic rate signal having a rate frequency corresponding to the rate of change of the output frequency;
   phase detection means for comparing the rate signal to a periodic reference signal having a fixed reference frequency, and for producing a correction signal having a voltage corresponding to the difference between the phases of the rate and reference signals;
   transconductance filter means for filtering the correction signal to produce a first current signal, which is a function of the voltage of the correction signal; and
   integration means for integrating the first current signal to produce the tuning signal, said integration means including an integration capacitance substantially comprising the inherent capacitance of a conductor carrying the first current signal and the input capacitance of the voltage controlled oscillator.

11. The radar system of claim 10, further comprising a current source for producing a second current signal having a constant magnitude, and wherein the integration means integrates the combined first and second current signals to produce the tuning signal.

12. The radar system of claim 10, further comprising retrace means for producing a periodic retrace signal operative to periodically initialize the integration means, to thereby cause the output signal to periodically sweep in frequency.

13. The radar system of claim 12, wherein the reference signal and the retrace signal are coherent, and wherein there is an integer relationship between the frequencies of the reference and retrace signals.

14. The radar system of claim 10, wherein the rate detector means comprises a first local oscillator for producing a periodic first mixing signal at a first mixing frequency, first mixing means for combining the first mixing signal with the output signal to produce a periodic first IF signal at a first IF frequency equal to the difference between the output and first mixing frequencies, a second local oscillator for producing a periodic second mixing signal at a second mixing frequency, second mixing means for combining the second mixing signal with the output signal to produce a periodic second IF signal at a second IF frequency equal to the difference between the output and second mixing frequencies, delay means for delaying the second IF signal by a predetermined time delay to produce a delayed second IF signal, and third mixing means for combining the first IF signal with the delayed second IF signal to produce the rate signal.

15. The radar system of claim 14, wherein the reference signal and the difference between the first and second mixing signals are coherent with respect to one another, and wherein there is an integer relationship between the frequency of the reference signal and the frequency of the difference signal between the first and second mixing signals.

16. The radar system of claim 10, wherein the voltage controlled oscillator, the rate detector means, the phase detection means, the filter means and the integration means comprise a type II phase lock loop.

17. The radar system of claim 16, wherein the rate frequency is outside the bandwidth of the phase lock loop.

18. The radar system of claim 10, wherein the voltage controlled oscillator is a Gunn oscillator and wherein the output frequency is in the MMW frequency band.

19. A method for generating a periodic output signal having an output frequency that varies linearly with time, the method comprising:
   providing a voltage controlled oscillator having input and output terminals, an input capacitance associated with its input terminal, and operative to produce the output signal at its output terminal at the output frequency such that the output frequency corresponds to the voltage of a tuning signal applied to the input terminal;
   producing a periodic rate signal having a rate frequency corresponding to the rate of change of the output frequency;
   comparing the rate signal to a periodic reference signal having a fixed reference frequency, and producing a correction signal having a voltage corresponding to the difference between the phases of the rate and reference signals;
   filtering the correction signal to produce a first current signal which is a function of the voltage of the correction signal; and
   integrating the first current signal to produce the tuning signal using the inherent capacitance of a conductor carrying the first current signal and the input capacitance of the voltage controlled oscillator as an integration capacitance.

20. The method of claim 19, wherein the integrating step comprises integrating the first current signal and a second current signal having a constant magnitude to produce the tuning signal.

* * * * *